(12) United States Patent
Yoneda et al.

(10) Patent No.: US 6,548,798 B2
(45) Date of Patent: Apr. 15, 2003

(54) SOLID-STATE IMAGE SENSING DEVICE

(75) Inventors: Tomoya Yoneda, Atsugi (JP); Toru Koizumi, Yokohama (JP); Tetsunobu Kochi, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/334,302

(22) Filed: Jun. 16, 1999

(65) Prior Publication Data

US 2002/0096621 A1 Jul. 25, 2002

(30) Foreign Application Priority Data

Jun. 24, 1998 (JP) .......................................... 10-177642

(51) Int. Cl.[7] .............................................. H01L 27/00
(52) U.S. Cl. .................................................. 250/208.1
(58) Field of Search ........................... 250/208.1, 214.1; 348/256, 314, 299, 301; 257/229, 230, 445

(56) References Cited

U.S. PATENT DOCUMENTS

| | | | | | |
|---|---|---|---|---|---|
| 4,242,599 | A | * | 12/1980 | Suzuki | 257/230 |
| 4,763,196 | A | * | 8/1988 | Sakai | 358/213.13 |
| 4,890,164 | A | * | 12/1989 | Takei et al. | 358/213.19 |
| 4,903,097 | A | * | 2/1990 | Nash | 357/24 |
| 4,977,584 | A | * | 12/1990 | Kohno et al. | 257/223 |
| 5,043,571 | A | * | 8/1991 | Hasegawa | 250/226 |
| 5,455,443 | A | * | 10/1995 | Maki et al. | 257/323 |
| 5,977,576 | A | * | 11/1999 | Hamasaki | 257/292 |

* cited by examiner

Primary Examiner—Zandra V. Smith
(74) Attorney, Agent, or Firm—Robin, Blecker & Daley

(57) ABSTRACT

An object of the invention is to control a saturation electric charge quantity of a photodiode within a chip, thereby to drive a solid-state image sensing device adequately. The solid-state image sensing device according to the present invention comprises the photodiode as a photo-electric converting device and an overflow drain device controlled corresponding to the saturation electric charge quantity of the photodiode, both of which are provided within the same chip.

5 Claims, 10 Drawing Sheets

SOLID-STATE IMAGE SENSING DEVICE

BACKGROUND OF THE INVENTION

1. Field of the Invention

The present invention relates to a solid-state image sensing device which includes a photo-electric converting device, a transfer switching device, a floating diffusion area etc. in a pixel.

2. Brief Description of the Related Art

Up to now, a pixel of a metal-oxide-semiconductor (referred to as "MOS")-type solid-state image sensing device has in general a constitution shown in FIG. 15 (PRIOR ART) while each of the other pixels of the same type has a similar constitution to that shown in FIG. 15, respectively. In the figure, a numerical sign 1 stands for a photodiode which is employed as a photo-electric converting device, 2 stands for a transfer switch for transferring electric charges photo-electrically generated by the photo-electric converting device 2, 3 stands for a floating diffusion area whereto the converted electric charge is transferred, 4 stands for an MOS transistor for amplifying a voltage of the floating diffusion area, 5 stands for an output signal terminal for delivering an electric charge signal outside the pixel, 6 stands for a power supply terminal for supplying an electric power to drive the pixel, 7 stands for a constant current source for operating the MOS transistor 4 in source follower configuration and 8 stands for a reset switch for resetting a potential of the floating diffusion area 3 to a voltage of the power supply.

Subsequently, an operational sequence of the MOS-type solid-state image sensor shown in FIG. 15 is described. The floating diffusion area 3 is reset first and is set at a floating state. Then the electric charges stored in the photodiode 1 is transferred to the floating diffusion area 3 by means of turning on the transfer switch 2. The transferred signal is provided as a voltage signal of the floating diffusion area 3 through a source follower circuit which is constituted of, the MOS transistor 4, the power supply 6 and the constant current source 7 from the output terminal 5 toward an outside of the pixel.

Herein, a potential of each portion with respect to an electron is illustrated in FIGS. 16A (PRIOR ART) and 16B (PRIOR ART). FIG. 16A is a view showing a saturation state of the electrons which are stored in the photodiode 1. A quantity of the electrons which fill a potential well is a saturation electric charge quantity while a bottom of the well represents a potential corresponding to a depletion voltage. Further, a bottom of a potential well of the floating diffusion area 3 stands for a potential corresponding to the reset voltage.

On the other hand, FIG. 16B is a view showing another state wherein the electrons are transferred to the floating diffusion area 3 by means of turning on the transfer switch 2. Herein, the term of "saturation voltage" is defined by a voltage of the floating diffusion area 3 when the saturation electric charge quantity of the photodiode 1 is transferred to the floating diffusion area 3. Accordingly, if the saturation voltage is higher than the depletion voltage, all of the electric charges stored in photodiode 1 are transferred to the floating diffusion area 3 as shown in the present figure so that the photodiode 1 is depleted, which enables the depletion transfer.

Namely, if the saturation voltage of the floating diffusion area 3 is higher than the depletion voltage of the photodiode 1 as mentioned above, all information included in the photodiode 1 is delivered outward.

However, the conventional technology mentioned above has defects described below: First, it is impossible to attain a constant saturation voltage because of a variance in saturated electric charge quantity induced by dispersed manufacturing parameters which take place in manufacturing steps of the photodiodes 1.

Accordingly, it appears that the depletion voltage turns higher than the saturation voltage in some cases as can be seen from FIG. 17 (PRIOR ART). On that occasion, when the electrons are stored up to a vicinity of the saturation electric charge quantity of the photodiode 1, the stored electrons cannot be thoroughly transferred to the floating diffusion area 3 even if the transfer switch 2 is turned on. Consequently, the electrons are left in the photodiode 1 after turning off the transfer switch 2, which means that all information included in the photodiode 1 is not always exhausted.

Further, the electrons residual in photodiode 1 after turning off the transfer switch 2 are added to information during reading out a subsequent voltage signal by means of turning on the transfer switch 2 so that another defects that not only a constant saturation voltage is unobtainable but also erroneous information is provided to the floating diffusion area 3 are generated.

Accordingly, the conventional technology includes origins which cause after-image and blooming phenomena during operating of the solid-state image sensing device when information of the photodiode 1 is not adequately provided to the floating diffusion area 3 as mentioned above. As a result, the image sensing operation cannot be performed suitably.

SUMMARY OF THE INVENTION

To solve the problems mentioned above, an object of the present invention is to control a saturation electric charge quantity of a photo-electric converting device within a chip so that the saturation voltage turns higher than the depletion voltage, thereby to adequately operate a solid-state image sensing device. Another object of the invention is to simply and automatically control the saturation electric charge quantity of the photo-electric converting device.

To satisfy the purposes mentioned above, a solid-state image sensing device according to the present invention is to constitute a photo-electric converting device and an overflow drain device, of which overflow drain level is controlled corresponding to the saturation electric charge quantity of the photo-electric converting device, within a chip.

Further, another constitution according to the present invention is to provide another solid-state image sensing device, comprising:

a photo-electric converting device;

a transfer switch for transferring electric charges photo-electrically generated by the photo-electric converting device;

a floating diffusion area which is the target of the electric charge to be transferred; and an amplifying part for amplifying the voltage of the floating diffusion area, wherein;

a gate electrode of the transfer switch is employed as a controlled electrode for a lateral overflow drain structure.

In the constitutions according to the present invention mentioned above, an overflow drain level defined individually corresponding to the saturation electric charge quantity in each chip corrects the saturation electric charge quantity within the chip so that the saturation voltage turns higher than the depletion voltage.

DETAILED DESCRIPTION OF THE PREFERRED EMBODIMENTS

Hereinafter detailed are the preferred embodiments according to the present invention with reference to the drawings from FIG. 1 to FIG. 14. The best modes contemplated by the inventors during carrying out the invention into practice will also be described corresponding to the preferred embodiments.

Embodiment 1

Figure 1:
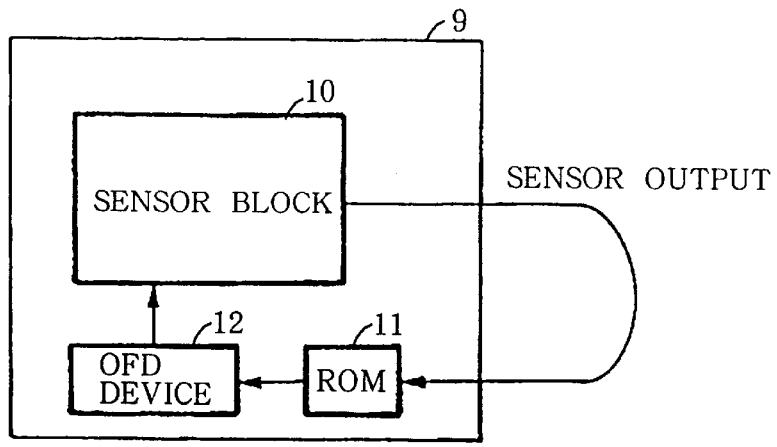
FIG. 1 is a block diagram showing a constitution thereby to control an overflow drain level in Embodiment 1 according to the present invention.

FIG. 1 is a block diagram showing a constitution of an image sensing device chip in the present embodiment. With reference to FIG. 1, the present embodiment is schematically described. In the figure, a numeric sign 9 stands for a sensor chip wherein there exist a sensor block 10 formed of a plurality of pixels each having a photo-electric converting device, a read-only memory (referred to as "ROM" hereinafter) block 11 for recording sensor output information produced from the sensor block 10 and an Overflow drain (referred to as "OFD") device block 12. As can be seen from FIG. 1, all of those three blocks are provided on the same one-chip sensor 9.

Subsequently, operations of the sensor chip 9 according to the present embodiment are described. First, when the sensor chip 9 is inspected, the saturation electric charge quantity which are storable in a photodiode 1 is detected externally out of the sensor chip 9 by means of measuring the sensor output produced from the sensor chip 9 during illuminating the sensor block 10 in rays of a light. Then information corresponding to the sensor output of the detected saturation electric charge quantity is recorded on the ROM 11.

Then, when the sensor block 10 is driven, the overflow drain level is applied to the overflow drain device 12 corresponding to information about the saturation electric charge quantity which has been recorded on ROM 11 so that the overflow drain device 12 controls the saturation electric charge quantity of the photodiode 1 etc.

Next, a case wherein a transfer switch 2 is employed as the overflow drain device is to be described. FIG. 2C is an equivalent circuit of a pixel wherein the transfer switch 2 is employed as the overflow drain device. In the figure, 1 stands for the photodiode acting as a sort of photo-electric converting devices, 2 stands for a transfer switch for transferring the photo-electrically generated electric charge, 3 stands for a floating diffusion area acting as the transfer target of the electric charges, 4 stands for an MOS transistor for amplifying the voltage of the floating diffusion area 3, 5 stands for an output signal terminal for providing an electric charge signal externally out of the pixel, 6 stands for a power supply terminal for operating the pixel, 7 stands for a constant current source for driving the MOS transistor 4 as a source follower configuration and 8 stands for another MOS transistor for reset switch use.

Although a constitution of the pixel herein is similar to that of the conventional pixel described previously, it is unnecessary to provide additionally the overflow drain device 12 in the present embodiment because the gate voltage of the transfer switch 2 during an OFF-status of the switch is employed as the overflow drain level thereby to control the saturation electric charge quantity of the photodiode 1 by means of applying the transfer switch 2 as the overflow drain device 12.

Furthermore, the devices shown in the present figure are described being correspondent to FIG. 1. Each pixel constituting the sensor block 10 includes the photodiode 1, the transfer switch 2, the floating diffusion area 3, the MOS transistor 4, the reset switch 8 and further the overflow drain device 12 because the transfer switch 2 is employed as the overflow drain device 12. Herein the operation of the pixel is omitted from the description since it is similar to that of the conventional pixel.

The operation of the present embodiment is further described with reference to FIGS. 2A and 2B. Herein FIG. 2A and 2B are views showing a transferring state in electric charges toward the floating diffusion area 3 by means of a potential height illustration seen from an electron when the saturation electric charge quantity of the photodiode 1 is controlled being correspondent to an original saturation electric charge quantity.

Figure 2A:
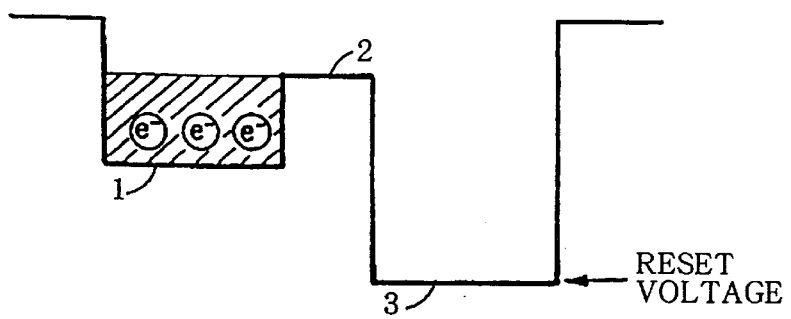
FIG. 2A is a view showing a state of a photodiode in Embodiment 1 of which well is full of stored electrons.

Particularly, FIG. 2A shows a state of the photodiode 1 wherein the electrons amounted up to the saturation electric charge quantity are stored during an OFF-state of the transfer switch 2 prior to turning-on. As shown in the present figure, the saturation electric charge quantity of the photodiode 1 is controlled by means of the gate electrode potential of the transfer switch 2 which is at the OFF-state. The supernatant portion of the saturation electric charge quantity which is induced in the conventional technology and designated by a broken line shown in FIG. 2B is sunk through the floating diffusion area 3 to the power supply terminal 6 by means of leaving the reset switch 8 turned-on.

Figure 2B:
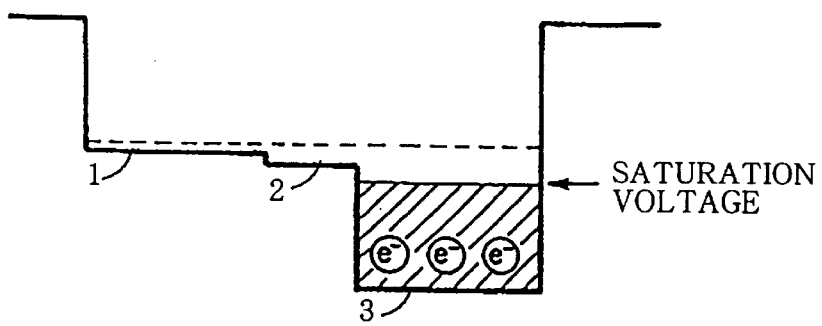
FIG. 2B is another view showing another state of the photodiode in Embodiment 1 from which the electrons are thoroughly transferred to a floating diffusion area.
Figure 2C:
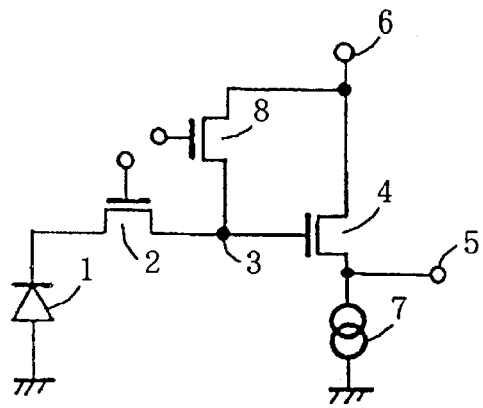
FIG. 2C is an equivalent circuit of a pixel constituting a solid-state image sensing device in embodiments according to the present invention.

Next, FIG. 2B illustrates a state after the reset switch is turned-off and the transfer switch is turned-on to transfer the electrons to the floating diffusion area 3, which follows the state shown in FIG. 2A. The saturation voltage can herein be higher than the depletion voltage.

Accordingly, FIGS. 2A and 2B indicate that the gate voltage control of the transfer switch 2 during the OFF-state can preliminarily sink the supernatant portion of the electric charges designated by the broken line shown in FIG. 2B out of the photodiode 1 to render the saturation voltage higher than the depletion voltage so that the electrons stored in the photodiode 1 can thoroughly be transferred to the floating diffusion area 3, which can guarantee a normal operation of the solid-state image sensing device no matter what a manufacturing variance in saturation electric charge quantity stored by the photodiode 1 may be.

Figure 2D:
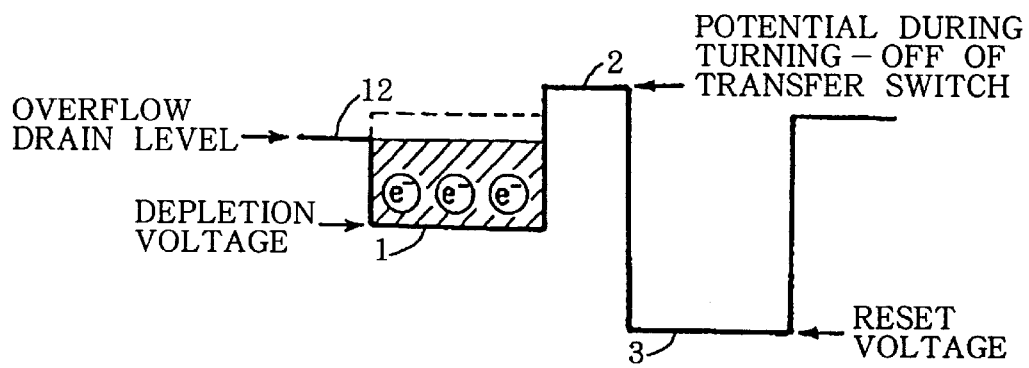
FIG. 2D is still another view showing still another state of the photodiode full of electrons in Embodiment 1 of which quantity is controlled with an overflow drain device.
Figure 2E:
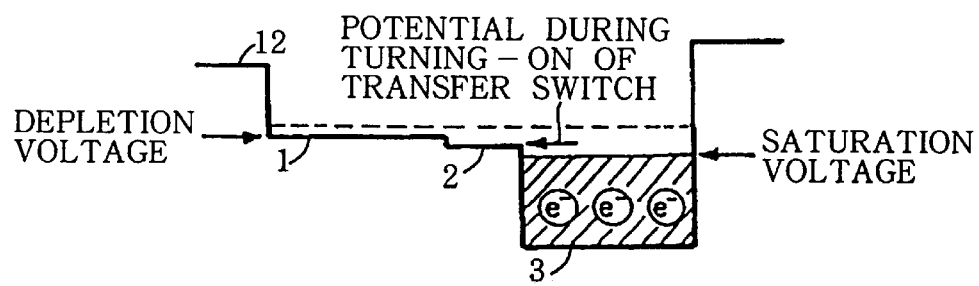
FIG. 2E is further still another view showing further still another status of the photodiode in Embodiment 1 wherein the electrons are thoroughly transferred to the floating diffusion area by turning-off a reset switch and turning-on a transfer switch from the state shown in FIG. 2D.

Although a lateral overflow drain structure wherein the overflow drain device 12 is employed as the transfer switch 2 is described in the present embodiment, the overflow drain device 12 is not necessarily restricted to be used as the transfer switch 2 at all. The overflow drain device 12 might be employed additionally, for instance, as shown in FIGS. 2D and 2E. It needs scarcely to be said that the overflow drain device 12 can be constituted in any structures, for instance, either in vertical or in lateral structure.

FIG. 2D is a view showing an OFF-state of the transfer switch 2 prior to turning-on wherein the electrons are stored in the photodiode 1 up to the saturation electric charge quantity which is controlled by the overflow drain device 12. The supernatant portion of the saturation electric charge quantity of the photodiode 1 induced by the conventional constitution which is identified with a broken line shown in FIG. 2D is sunk through the overflow drain 12.

FIG. 2E is a view for illustrating a potential diagram of the circuit after turning-off the reset switch 8 and turning-on the transfer switch 2 starting from the state as shown in FIG. 2D to transfer the electrons to the floating diffusion area 3. The present figure indicates that the saturation voltage turns higher than the depletion voltage.

Incidentally, it is satisfactory enough so long as information for indicating the level corresponding to the saturation electric charge quantity which is storable in the photodiode 1 can be recorded on ROM 11. Accordingly, the ROM 11 might be, for instance, a fuse ROM or another sort of ROM.

Embodiment 2

Figure 3:
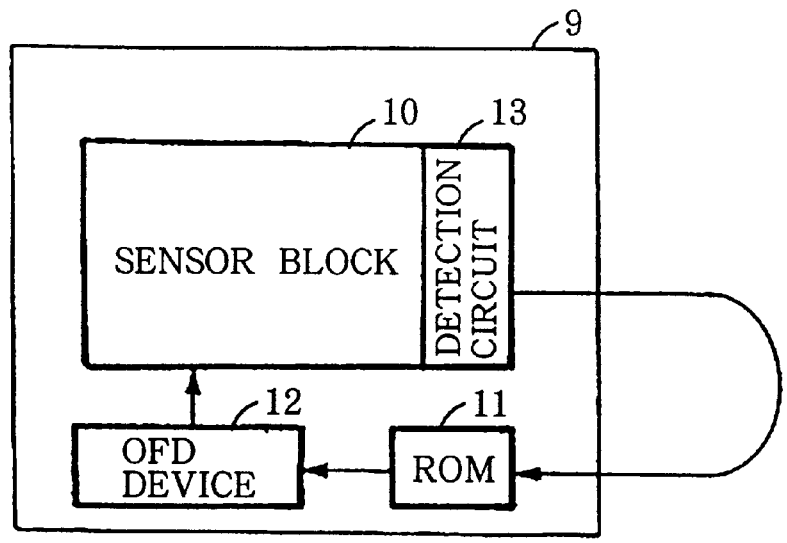
FIG. 3 is a block diagram showing a constitution thereby to control an overflow drain level in Embodiment 2.

FIG. 3 is a block diagram showing Embodiment 2. In the present embodiment, a numeric sign 9 stands for a sensor chip, 10 stands for a sensor block formed of a plurality of pixels, each of which includes a photo-electric converting device, 13 stands for a detection circuit for detecting the saturation electric charge quantity of a photodiode 1, 11 stands for a ROM for recording information and 12 stands for an overflow drain (OFD) device for controlling the photodiode 1.

The present embodiment has a constitution wherein the detection circuit 13 for detecting the saturation electric charge quantity of the photodiode 1 included in the sensor block 10 is additionally provided in the sensor chip 9 which is shown in Embodiment 1 mentioned above. Herein the present figure indicates that various blocks are provided on a single chip similarly to Embodiment 1. As a constitution within each pixel included in the sensor block 10 is the quite same as that of FIG. 2C, the description is omitted.

Then, operations of the sensor chip 9 according to the present embodiment are to be described. First, the saturation electric charge quantity of the photodiode 1 included in the sensor block 10 is detected by the detection circuit 13. An output signal produced from the detection circuit 13 is transferred outwardly. Next, information corresponding to the output signal is recorded on the ROM 11 from an external circuit. As the operations thereinafter are similar to those of Embodiment 1, the description is omitted.

Even if it has a constitution wherein an overflow drain device 12 is employed as a transfer switch 2, for instance, similarly to that of Embodiment 1, the overflow drain device 12 can be additionally provided. The fuse ROM and others, for instance, are employable as the ROM 11 similarly to Embodiment 1 as mentioned above.

Further, it does not matter whether the detection circuit 13 and the sensor block 10 may be connected to each other or disconnected from each other so long as the detection circuit 13 can detect the saturation electric charge quantity. Accordingly, it might have a constitution wherein a certain signal produced from the detection circuit 13 is applied to the sensor block 10 so that a responding output responded from the sensor block 10 is transferred again to the detection circuit 13, whereby the saturation electric charge quantity can be detected from the responded signal. It might have, of course, another constitution wherein the detection circuit 13 has a built-in transistor etc. having the same structures as those of the photodiode 1. Operations of the pixel itself are omitted herein because they are the same as those of Embodiment 1 mentioned above.

In the present embodiment, information can be recorded on the ROM 11 corresponding to the output signal produced from the detection circuit 13 which is provided in the sensor chip 9 even if the sensor output signal is not actually transferred externally outside the sensor chip 9 during illuminating the rays of light onto the sensor block 10.

Consequently, controlling the saturation electric charge quantity to a desired value can not only drive a solid-state image sensing device normally to operate but also can omit complicated procedures during an inspection process step.

Embodiment 3

Figure 4:
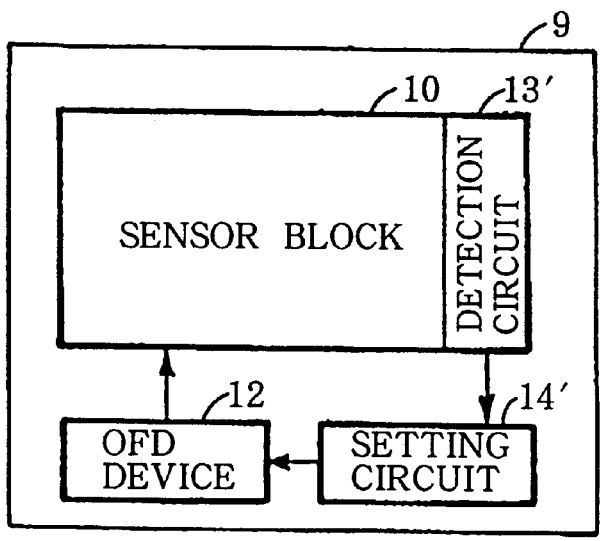
FIG. 4 is a block diagram showing a constitution thereby to control an overflow drain level in Embodiment 3.

FIG. 4 is a view showing a block diagram according to the present embodiment. In the present embodiment, a numeric sign 9 stands for a sensor chip, 10 stands for a sensor block formed of a plurality of pixels, each of which includes a photo-electric converting device, 13' stands for a detection circuit for detecting a saturation electric charge quantity, 14' stands for a setting circuit for setting an overflow drain level and 12 stands for an overflow drain (OFD) device for controlling a photodiode 1.

The present embodiment has a constitution wherein the setting circuit 14' for setting an overflow level of an overflow drain device 12 is provided instead of a ROM 11 in the constitutions according to Embodiments 1 and 2. As an inner constitution of each pixel included in the sensor block 10 is the same as that of FIG. 2C, the description is to be omitted.

Subsequently, operations of the sensor chip 9 according to the present embodiment is to be described. First, information about the saturation electric charge quantity of photodiode 1 which is detected by the detection circuit 13' is applied to the setting circuit 14' as an input signal. In the setting circuit 14', the overflow drain level is set from the applied input signal corresponding to the saturation electric charge quantity of the photodiode 1 to transfer the set overflow drain level to the overflow drain device 12. As other operations except for those mentioned above are the same as those of Embodiment 2, the description is to be omitted.

Herein actual circuits of the overflow drain device 12, the detection circuit 13' and the setting circuit 14' according to the present embodiment are illustrated with reference to FIGS. 5, 6 and 7, respectively.

Figure 5:
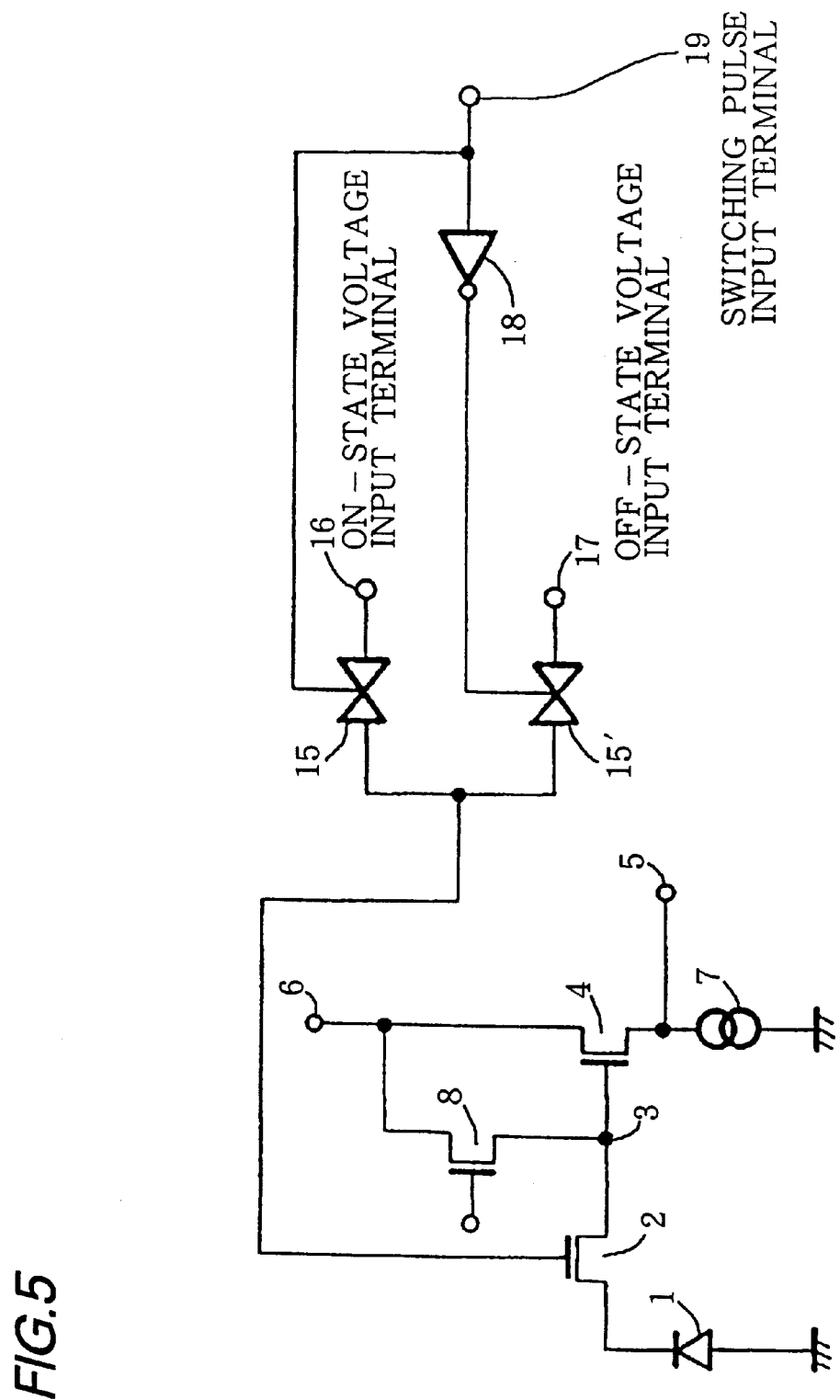
FIG. 5 is an equivalent circuit of overflow drain devices employed in embodiments according to the present invention.

First, a case wherein the overflow drain device 12 is employed as the transfer switch 2 is illustrated in FIG. 5.

In the present figure, a numeric sign 1 stands for a photodiode which acts as a photo-electric converting device, 2 stands for a transfer switch for transferring electric charges photo-electrically generated by the photodiode 1, 3 stands for a floating diffusion area for acting as a transfer target whereto the electric charges are transferred, 4 stands for an MOS transistor for amplifying a potential of the floating diffusion area 3, 5 stands for an output signal terminal wherethrough an electric charge signal is transferred outwardly from the pixel, 6 stands for a power supply terminal wherethrough an electric power for driving a pixel is supplied, 7 stands for a constant current source, 8 stands for a reset switch, 16 stands for an ON-state voltage signal input terminal for receiving an voltage signal which is applied to the gate electrode of the transfer switch 2 when the transfer switch 2 is turned on, 17 stands for an OFF-state voltage signal input terminal for receiving another voltage signal which is applied to the gate electrode of the transfer switch 2 when the transfer switch 2 is turned off, 15 and 15' stand for respective transfer gates for passing one of two input signals which are respectively applied to input voltage terminals 16 and 17 corresponding to an input pulse signal, 18 stands for a NOT gate for inverting the input signal applied to the voltage signal input terminal 17 and 19 stands for a pulse signal input terminal for receiving a pulse signal which switches the transfer switch 2 between the ON-state and the OFF-state.

Next, operations of the present embodiment are to be described. First, the pulse signal located either at the HIGH level or at the LOW level to be described later is applied to the switching pulse input terminal 19. The voltage signal which is applied to the gate electrode of the transfer switch 2 varies depending upon the state of the input pulse whether it is at the HIGH level or at the LOW level. The present embodiment is constituted so that the transfer gates 15 and 15' apply the ON-state voltage to the gate electrode of the transfer switch 2 if the input pulse is at the HIGH level while they apply the OFF-state voltage if the input pulse is at the LOW level.

Actually, if the input pulse is at the HIGH level, the HIGH level pulse turns on the transfer gate 15, thereby to deliver the ON-state voltage signal provided from the ON-state voltage signal terminal 16 to the transfer switch 2.

If the input pulse is at the LOW level on the contrary, the LOW level signal is inverted through the NOT gate 18. The inverted signal turns on the transfer gate 15', thereby to deliver the OFF-state voltage signal provided from the OFF-state voltage signal terminal 17 to the transfer switch 2. As operations of the pixel are the same as those of Embodiment 1, the description is to be omitted herein.

Then the detection circuit 13' is to be described with reference to FIG. 6. In the figure, a numeric sign 20 stands for a junction-type transistor having the same structure as that of the photodiode 1 which is embedded in the pixel, 21 stands for a detection terminal which is connected to an input signal terminal 31 of the setting circuit 14' shown in FIG. 7, 22 stands for a resistor therethrough to feed a current to the junction-type transistor 20 and 23 stands for a power supply terminal therethrough to feed a saturation current to the junction-type transistor 20.

Figure 6:
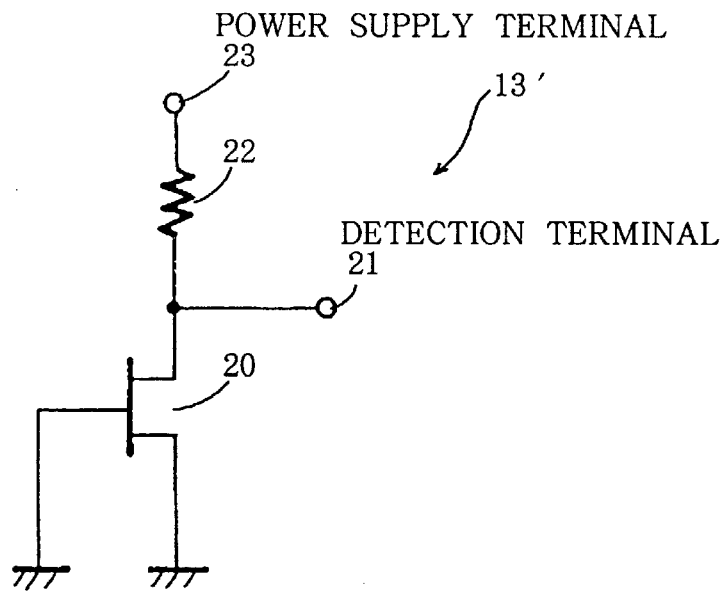
FIG. 6 is an equivalent circuit of a detection circuit 13' in Embodiment 3 according to the present invention.
Figure 8:
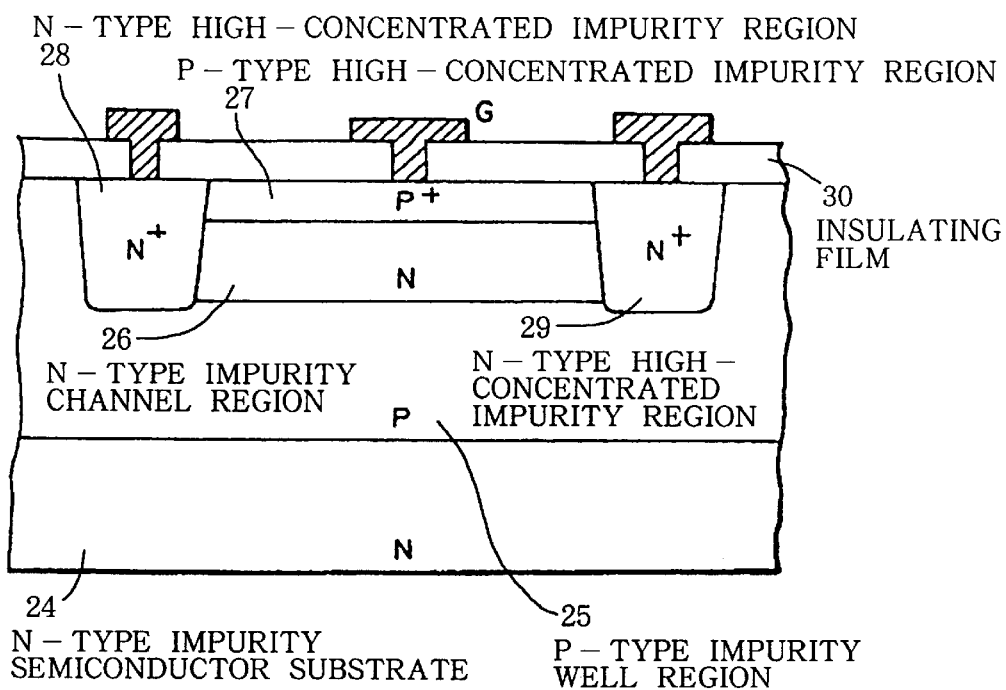
FIG. 8 is a cross-sectional view of a junction-type transistor included in the detection circuit of Embodiment 3.

FIG. 8 herein is a vertically cross-sectional view taken along a channel current flowing direction of the junction-type transistor 20 shown in FIG. 6. In FIG. 8, a numeric sign 24 stands for an N-type semiconductor substrate, 25 stands for a first region which is a well region formed by doping P-type impurity atoms, 26 stands for a second region which is an N-type channel region, 27 stands for a third region which is a $P^+$-type high-concentrated impurity region, 28 and 29 stand for $N^+$-type high-concentrated impurity regions, respectively, and 30 stands for an insulating film formed of such as a silicon dioxide film etc.

Herein the P-type impurity well region 25 and $P^+$-type high-concentrated impurity region 27 act as gate electrodes, respectively, to deplete the channel 26, the N-type impurity channel region 26 serves as the channel for conducting electrons and the $N^+$-type high-concentrated impurity regions 28 and 29 are employed as a source electrode and a drain electrode, respectively, having majority carriers. The source electrode and the gate electrode are connected structurally to each other and both grounded.

As the $P^+$-type high-concentrated region 27 is very thin in thickness, the impurity concentration in the region 27 is enhanced for usage than as usual. The concentration of impurity atoms included in the N-type channel region 26 is controlled so that desirable photo-electric converting characteristics are attainable. On the other hand, the P-type well region 25 is doped with a usual impurity dose which is used for manufacturing an ordinary P-well region of an MOSFET.

Hereinafter operations of the detection circuit 13' shown in FIG. 6 are to be described. First, a voltage supplied to the power supply terminal 23 is controlled so that a drain voltage of the junction-type transistor 20 turns to be a voltage which drives the junction-type transistor 20 to operate at a saturation region considering an voltage drop caused in the resistor 22 preliminarily. Next, the previously controlled voltage has the junction-type transistor 20 drive to operate in the saturation region wherein only the saturation current flows. The saturation current is detected by the detection circuit 13', thereby to be provided as a voltage signal outwardly from the detection terminal 21.

Namely, when the drain voltage of the junction-type transistor 20 shown in FIG. 8 turns high to some extents, a pinch-off phenomenon takes place in the channel 26. Only the saturation current flows between the drain and source regions 28 and 29 no matter what the drain voltage may be. As this saturation current can be regarded as the saturation electric charge quantity of the photodiode 1 which has the same structure as that of the junction-type transistor 20, detecting the above-mentioned saturation current by the use of the detection circuit 13' according to the present embodiment is regarded as actually detecting a sensor output of the sensor block 10.

Figure 7:
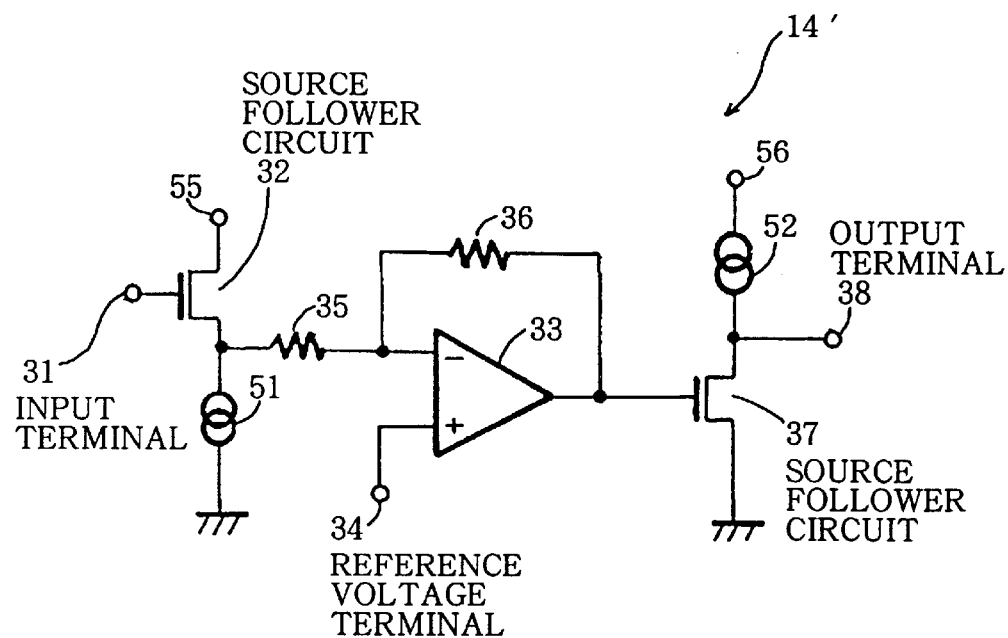
FIG. 7 is an equivalent circuit of a setting circuit 14' in Embodiment 3.

Furthermore, constitution of the setting circuit 14' shown in FIG. 7 is to be described. In the figure, the numeric sign 31 stands for the input signal terminal connected to the detection terminal 21, 32 stands for a source follower circuit for applying the detection result to an operational amplifier 33, 55 and 51 stand for a power supply terminal and a constant current source, respectively, for feeding a current to the source follower circuit 32, 33 stands for the operational amplifier, of which inverted input terminal is provided with a source output and of which non-inverting input terminal is provided with a reference voltage (referred to as "Vref" hereinafter) signal, 34 stands for a Vref terminal for receiving the Vref signal, 35 and 36 stand for resistors designed, respectively, so as to supply desirably specified output powers, 37 stands for a p-MOS source follower circuit, 56 stands for an electric power supply terminal for supplying a voltage source to the p-MOS source follower circuit 37, 52 stands for a constant current source for feeding a current to the source follower circuit 37 and 38 stands for an output signal terminal for delivering the OFF-state gate voltage of the transfer switch 2.

Operations of the setting circuit 14' begin with providing the detection output signal which is produced from the detection terminal 21 of the detection circuit 13' shown in FIG. 6 to the input signal terminal 31 connected to the gate electrode of the source follower circuit 32. Next, the source output which is produced from the power supply supplied to the power supply terminal 55 and from the resultant current fed through the constant current source 51 is inverting-amplified by the operational amplifier 33 having the resistors 35 and 36. The inverting-amplified output is further level-shifted by the p-MOS source follower 37 and delivered from the output terminal 38 as the OFF-state gate voltage to the OFF-state voltage signal input terminal 17 shown in FIG. 5 being produced from the power supply supplied to the power supply terminal 51 and from the resultant current fed through the constant current source 52.

Similarly, each device is designed to have a suitable characteristics as well as an adequate voltage is applied to the Vref terminal 34 so that the saturation electric charge quantity of the photodiode 1 may have a desirable value in saturation electric charge quantity.

Figure 9:
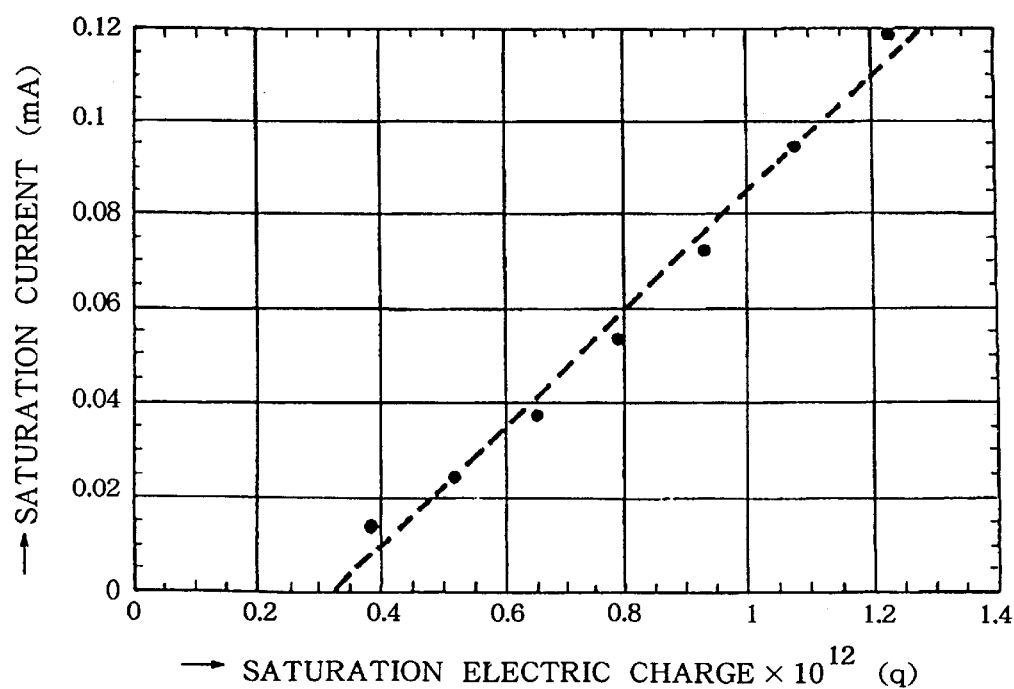
FIG. 9 is a graph showing a relationship between a saturation electric charge quantity and a saturation current 13' in the detection circuit of Embodiment 3.

FIG. 9 is a graph showing a saturation electric charge quantity dependence of a saturation current which is measured rendering an N-type impurity concentration included in the N-type channel region 26 of the junction-type transistor 20 as a parameter. The graph indicates a linear relationship between the current scaled on an ordinate and the the charge scaled on an abscissa. Accordingly, if the resistor 22 is assumed as a pure resistivity in the constitution mentioned above, a relationship existing between the voltage output appearing at the detection terminal 21 and the saturation electric charge quantity has to be, of course, a linear one of which coefficient is negative in a relationship between voltage and current.

Consequently, when the detection circuit 13' and the setting circuit 14' according to the present embodiment are operating, an employment of the detection output which is quite similar to the sensor output of the sensor block 10 enables to set the OFF-state voltage in the setting circuit 14' and further to control the overflow drain device 12.

Accordingly, as each dispersion in saturation electric charge quantity induced in each chip during manufacturing can be automatically calibrated within a chip even though the step wherein information about the saturation electric charge quantity of the photodiode 1 is recorded on the ROM 11 as mentioned previously in Embodiments 1 and 2 is omitted, the present embodiment can control the saturation electric charge quantity of the photodiode 1 to be the desired value and adequately perform the solid-state image sensing operations similarly to Embodiments 1 and 2.

Embodiment 4

Figure 10:
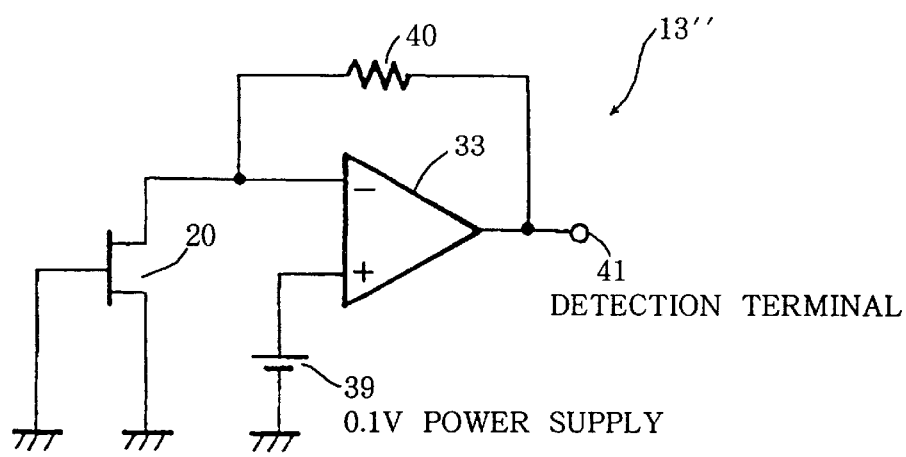
FIG. 10 is an equivalent circuit of a detection circuit 13" in Embodiment 4 according to the present invention.

FIG. 10 is a circuit diagram showing a detection circuit 13" for detecting a saturation electric charge quantity of a photodiode 1 according to Embodiment 4. In the figure, a numeric sign 20 stands for a junction-type transistor having the same structure as that of the photodiode 1, 33 stands for an operational amplifier, of which inverting input terminal is connected to a drain electrode of the junction-type transistor 20 and of which non-inverting input terminal is connected to a power supply for supplying a Vref voltage, 39 stands for a power supply having, for instance, 0.1 volt (referred to as "V" hereinafter) which is connected to the non-inverting input terminal of a differential amplifier 33, 40 stands for a resistor connected between an input and an output terminals of the operational amplifier 33 and 41 stands for a detection terminal for providing a detection signal output.

Figure 12:
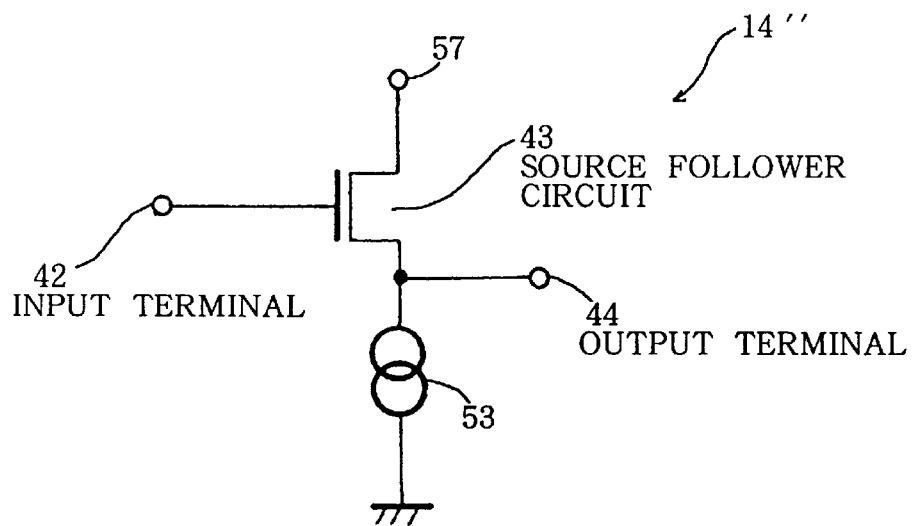
FIG. 12 is an equivalent circuit of a setting circuit 14" in Embodiment 4.

On the other hand, FIG. 12 is a circuit diagram showing a setting circuit 14" for delivering an OFF-state gate voltage of the transfer switch 2 corresponding to an output signal produced from the detection circuit 13" mentioned above. The setting circuit 14" is constituted of an input terminal 42 for receiving the detection output signal provided from the detection terminal 41, a source follower circuit 43 for level-shifting the provided detection output signal and an output terminal 44 for delivering an OFF-state gate voltage.

Furthermore, as the detection circuit 13" according to the present embodiment is differently constituted in structure from the detection circuit 13' of Embodiment 3 mentioned above for driving the junction-type transistor 20 to operate in an unsaturation region, the setting circuit 14" is also differently constituted in structure from the setting circuit 14' of Embodiment 3.

Herein each device included in the detection circuit 13" and the setting circuit 14" is preliminarily designed to have an adequate value in characteristics so that the saturation electric charge quantity of the photodiode 1 may be a desirable saturation electric charge quantity similarly to Embodiment 3.

Subsequently, operations of the detection circuit 13" are to be described with reference to FIG. 10. As a drain voltage of the junction-type transistor 20 turns to be 0.1 V, the same as that of the 0.1 V power supply 39, the junction-type transistor 20 operates at the unsaturation region. On the other hand, as a drain current of the junction-type transistor 20 flows through the resistor 40, a voltage value which is obtained by multiplicating the drain current flowing through the junction-type transistor 20 by a resistivity value of the resistor 40 and then by adding with 0.1 V appears at the detection terminal 41.

Figure 11:
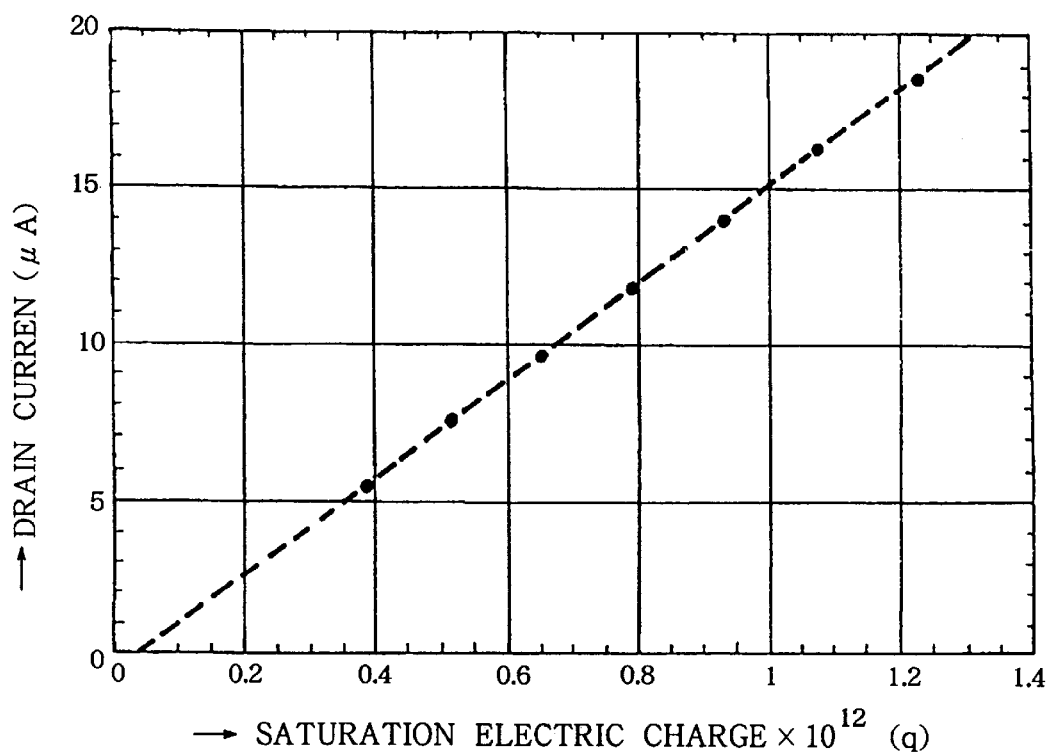
FIG. 11 is a graph showing a saturation electric charge quantity dependence of a saturation current in the detection circuit 13" of Embodiment 4.

FIG. 11 is a graph showing a saturation electric charge quantity dependence of the drain current which is measured rendering an N-type impurity concentration included in an N-type channel region of the junction-type transistor 20 as a parameter. As the drain current scaled on an ordinate exhibits a linear relationship with respect to the saturation electric charge quantity scaled on an abscissa as shown in FIG. 11, a relationship between the voltage of the detection terminal 41 and the saturation electric charge quantity of the junction-type transistor 20 is also linear. Incidentally, it is only an exemplification that the source voltage of the power supply 39 shown in FIG. 10 is set as 0.1 V. The source voltage of the power supply 39 is not limited to 0.1 V so long as it can drive the junction-type transistor 20 to operate in the unsaturation region.

Then operations of the setting circuit 14″ are to be described with reference to FIG. 12. A voltage delivered from the above-mentioned detection terminal 41 is received through the input terminal 42 of the source follower circuit 43 to be applied to the gate electrode of the source follower circuit 43 as a gate voltage. A source voltage of the source follower circuit 43 produced from the electric power supplied from the power supply terminal 57 and the constant current source 53 is provided at the output terminal 44. Namely, an output voltage provided at the output terminal 44 is dependent upon the input voltage received from the input terminal 42. The output voltage mentioned above is subsequently fed to the overflow drain device 12 to serve as the gate voltage during the OFF-state of the transfer switch 2.

Accordingly, the constitution according to the present embodiment can be set so as to suppress the electronic accumulation below a level adjacent to the saturation electric charge quantity of the photodiode 1 by means of driving the junction-type transistor 20 to operate in the unsaturated region which is attainable by employing the 0.1 V power supply 39. As a result, the constitution mentioned above can perform an adequate image sensing operation because it can set an overflow drain level of the overflow drain device 12 so that a depletion voltage may not exceed the saturation voltage.

Embodiment 5

Figure 13:
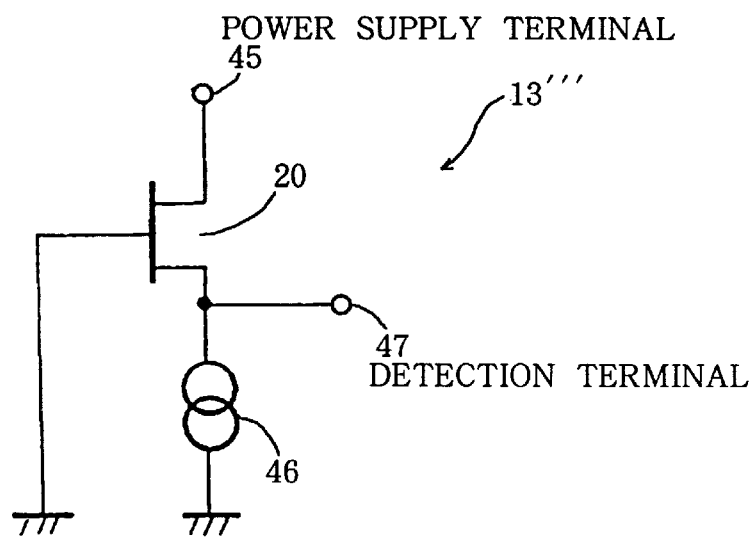
FIG. 13 is an equivalent circuit of a detection circuit 13'" in Embodiment 5 according to the present invention.

FIG. 13 is a view for showing a detecting circuit 13′″ for detecting the saturation electric charge quantity of a photodiode 1 for use in Embodiment 5. In the figure, a numeric sign 20 stands for a junction-type transistor having the same structure as that of the photodiode 1, 45 stands for a power supply terminal for supplying a power for driving the junction-type transistor 20 to operate, 46 stands for a constant current source for feeding a current to the junction-type transistor and 47 stands for a detection terminal for detecting an output signal produced from the junction-type transistor 20.

First, operations of the detection circuit 13′″ shown in FIG. 13 are to be described. A voltage for driving the junction-type transistor 20 to operate at a saturation region is supplied to the power supply terminal 45. The constant current source 46 feeds a minute current from the power supply terminal 45 through the junction-type transistor 20 toward the ground (referred to as "GND"). As the junction-type transistor 20 is driven to operate in the saturation region during that, the minute current mentioned above turns to be a saturation current of the junction-type transistor 20, which provides the depletion voltage of the junction-type transistor 20 to the voltage detection terminal 47 as an output signal.

Figure 14:
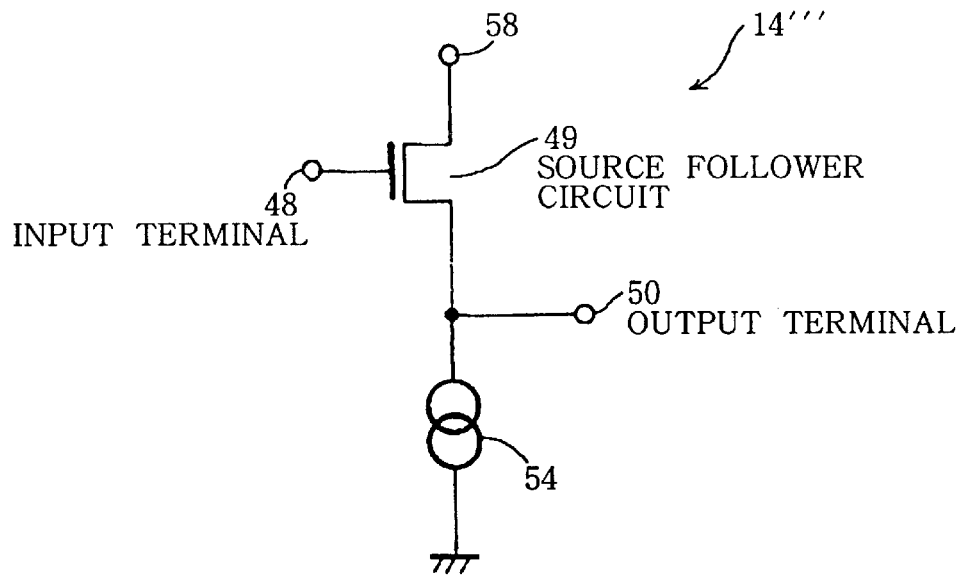
FIG. 14 is an equivalent circuit of a setting circuit 14'" in Embodiment 5 according to the present invention.
Figure 15:
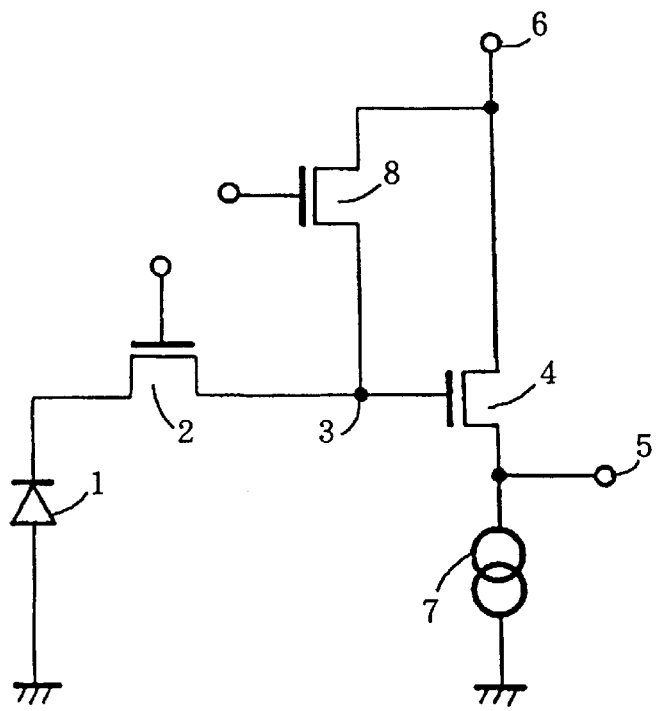
FIG. 15 (PRIOR ART) is an equivalent circuit of a pixel constituting a conventional solid-state image sensing device.
Figure 16A:
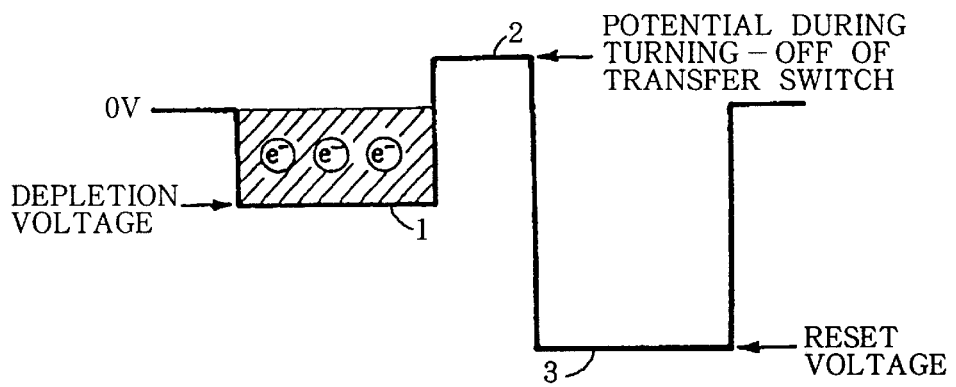
FIG. 16A (PRIOR ART) is a view showing a state of a photodiode in the conventional pixel of which well is full of stored electrons.
Figure 16B:
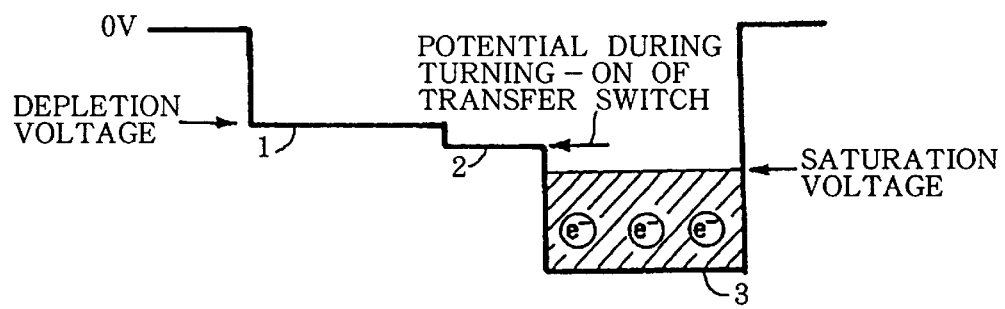
FIG. 16B (PRIOR ART) is another view showing another state of another conventional photodiode from which the electrons are thoroughly transferred to a floating diffusion area.
Figure 17:
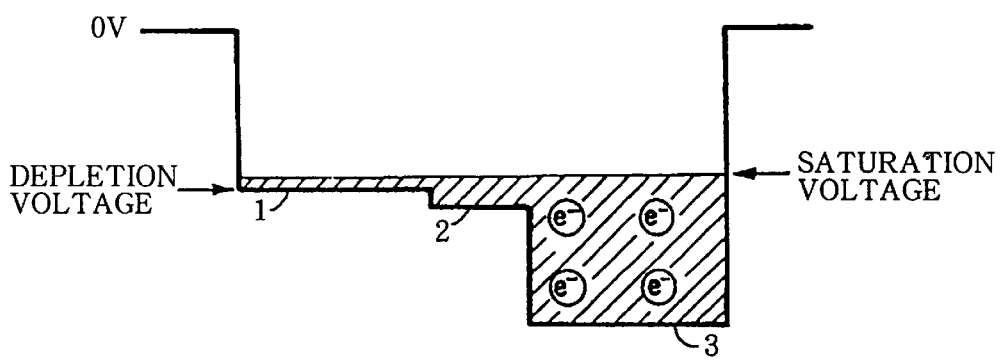
FIG. 17 (PRIOR ART) is still another view showing still another state of still another conventional photodiode from which the electrons are transferred to the floating diffusion area when a depletion voltage is higher than a saturation voltage.

FIG. 14 is a circuit diagram showing a setting circuit 14′″ for applying a gate electrode apply voltage during an OFF-state of a transfer switch 2 corresponding to the output signal provided from the detection circuit 13′″ mentioned above.

The setting circuit 14′″ is constituted of an input terminal 48 for receiving the output signal provided from the detection terminal 47, a source follower circuit 49 for level-shifting, an output terminal 50 for providing the OFF-state gate electrode voltage of the transfer switch 2, an electric power supply terminal 58 for supplying a voltage to the source follower circuit 49 and a constant current source 54 for driving the source follower circuit 49 to operate.

The output voltage provided from the detection terminal 47 shown in FIG. 13 is applied to the input terminal 48 of the source follower circuit 49 to be level-shifted by the source follower circuit 49 so that the saturation electric charge quantity of the photodiode 1 turns to be a desirable value which is delivered at the output terminal 50 to be fed externally to a load. Accordingly, an output voltage provided from the output terminal 50 is dependent upon the detection output produced from the detection terminal 47.

Consequently, the present embodiment drives the junction-type transistor 20 to operate in an unsaturated region thereby to detect the depletion voltage of the junction-type transistor having the same device structure as that of the photodiode 1, which enables to set an overflow level of the overflow drain device 12 adequately by a use of the setting circuit 13′″.

The property which is characteristic to each embodiment mentioned above that the saturation electric charge quantity of the photodiode 1 is controlled by the overflow drain device 12 is similarly expectable, for instance, even in a charge coupled device (referred to as "CCD") to have a splendid effect.

As the constitutions according to Embodiments 1 to 5 compensate the dispersed values in saturation electric charge quantity of the photodiode 1, that are induced between the diode cells during manufacturing, within a chip as mentioned above, the constitutions can drive the solid-state image sensing device adequately, which results in enabling to eliminate anomalous images during image-sensing operation such as an afterimage. Accordingly, the constitutions can not only improve a manufacturing yield of the solid-state image sensing devices but also realize to simplify as well as to automate the compensation procedures mentioned above.

What is claimed is:

1. A solid-state image sensing device, comprising:
   a plurality of photo-electric converting devices;
   a memory in which information on saturation electric charge quantities of respective said plurality of photo-electric devices is stored; and
   an overflow drain device having a controlling terminal through which overflow drain level is controlled based on information stored in said memory, wherein:
   said plurality of photo-electric converting devices, said memory and said overflow drain device are formed within a single chip.

2. The solid-state image sensing device according to claim 1, further comprising:
   a detecting circuit for detecting said saturation electric charge quantity of said photo-electric converting device, wherein:
   said detecting circuit is formed within said single chip.

3. A solid-state image sensing device having a plurality of pixels, said plurality of pixels respectively comprising:
   a photo-electric converting device;
   a transfer switch for transferring an electric charge which is photo-electrically generated by said photo-electric converting device;

a floating diffusion area which is the transfer target of said electric charge; and an amplifying part for amplifying a potential of said floating diffusion area, wherein:

information on saturation electric charge quantities of respective photo-electric devices is stored in a memory;

a gate electrode of said transfer switch employed as a control terminal having a lateral overflow drain structure is controlled based on information stored in said memory; and said plurality of pixels and said memory are formed within a single chip.

4. A solid-state image sensing device, comprising:

a photo-electric converting device;

an overflow drain device having a controlling terminal through which overflow drain level is controlled corresponding to said saturation electric charge quantity of said photo-electric converting device;

a detecting circuit for detecting a saturation electric charge quantity of said photo-electric converting device, wherein said photo-electric converting device includes:

a first region having a first conductive type;

a second region having a second conductive type which is embedded in said first region; and a third region having said first conductive type between said second region and a surface of said photo-electric converting device, and said detection circuit including:

a junction type transistor having said first region and said third region employed as control terminals; and said second region employed as a channel region, wherein:

said detection circuit is the same structure as that of said photo-electric converting device and is formed within a single chip.

5. The solid state image sensing device according to any one of claims 1, 2, 3 or 4, wherein said photo-converting device includes a photodiode.

* * * * *